United States Patent
Chen et al.

(10) Patent No.: US 12,047,222 B2
(45) Date of Patent: Jul. 23, 2024

(54) AI-ASSISTED COMMUNICATION CIRCUIT OPTIMIZATION

(71) Applicant: MediaTek Inc., Hsinchu (TW)

(72) Inventors: Po-Yu Chen, Hsinchu (TW); Yen-Liang Chen, Hsinchu (TW); Chi-Tsan Chen, Hsinchu (TW); Chao-Wei Wang, Hsinchu (TW)

(73) Assignee: MediaTek Inc., Hsinchu (TW)

( * ) Notice: Subject to any disclaimer, the term of this patent is extended or adjusted under 35 U.S.C. 154(b) by 88 days.

(21) Appl. No.: 17/857,134

(22) Filed: Jul. 4, 2022

(65) Prior Publication Data
US 2023/0006877 A1    Jan. 5, 2023

Related U.S. Application Data

(60) Provisional application No. 63/218,435, filed on Jul. 5, 2021.

(51) Int. Cl.
*H04L 27/36* (2006.01)
*H03F 1/32* (2006.01)
*H04B 1/04* (2006.01)
*H04B 1/12* (2006.01)
*H04B 1/30* (2006.01)

(52) U.S. Cl.
CPC ......... *H04L 27/364* (2013.01); *H03F 1/3294* (2013.01); *H04B 1/0475* (2013.01); *H04B 1/12* (2013.01); *H04B 1/30* (2013.01)

(58) Field of Classification Search
CPC .............. H04L 27/364; H04L 27/367; H04L 27/368; H04L 25/03165; H03F 1/3241; H03F 1/3247; H03F 1/3294; H04B 1/30; H04B 1/04; H04B 1/0475; H04B 1/10; H04B 1/12; H04B 1/123; H04B 15/00; H04B 15/005; G06N 3/045; G06N 3/09
See application file for complete search history.

(56) References Cited

U.S. PATENT DOCUMENTS

| 10,305,553 | B2 | 5/2019 | O'Shea | |
| 10,931,320 | B2 * | 2/2021 | Megretski | H03F 1/3247 |
| 11,431,300 | B2 * | 8/2022 | Barbu | H03F 3/19 |

(Continued)

FOREIGN PATENT DOCUMENTS

EP    2 538 553 A1 * 12/2012

OTHER PUBLICATIONS

Chance Tarver, et al. "Design and Implementation of a Neural Network Based Predistorter for Enhanced Mobile Broadband," arXiv:1907.00766, Jul. 1, 2019.

*Primary Examiner* — Betsy Deppe
(74) *Attorney, Agent, or Firm* — Tong J. Lee

(57) ABSTRACT

A radio frequency (RF) communication assembly includes an RF communication circuit and a compensator apparatus. The compensator apparatus receives an input including an I-component of a pre-compensated signal, a Q-component of the pre-compensated signal, and encoded operating conditions of the RF communication circuit. The RF communication circuit includes RF circuit components causing signal impairments. The compensator apparatus perform neural network computing on the input, and the RF communication assembly generates a compensated output signal that compensates for at least a portion of the signal impairments.

20 Claims, 6 Drawing Sheets

(56) References Cited

U.S. PATENT DOCUMENTS

| | | | |
|---|---|---|---|
| 2013/0223499 A1* | 8/2013 | Dark | H04B 15/00 375/226 |
| 2019/0097866 A1 | 3/2019 | Sestok | |
| 2021/0367690 A1 | 11/2021 | O'Shea et al. | |

* cited by examiner

AI-ASSISTED COMMUNICATION CIRCUIT OPTIMIZATION

CROSS-REFERENCE TO RELATED APPLICATIONS

This application claims the benefit of U.S. Provisional Application No. 63/218,435 filed on Jul. 5, 2021, the entirety of which is incorporated by reference herein.

TECHNICAL FIELD

Embodiments of the invention relate to the optimization of communication circuits using neural networks.

BACKGROUND

In modern wireless communication systems, radio frequency (RF) circuits are a major source of signal impairments that degrade system throughput. Among other impairments, nonlinearity and memory effects can cause severe spectral regrowth. Spectral regrowth significantly degrades the signal quality due to high out-of-band power. Memory effects cause asymmetry in transmitted signals. These impairments become more severe and complicated in current and next-generation wireless systems where wide bandwidths, high frequencies, high power, and high-order modulation are used. Moreover, in an edge device of 5G communication systems, both the high transmission power and the limited supply voltage can worsen the non-linearity of RF circuits.

The existing RF circuits in wireless communication systems can be further improved to benefit operators and users. These improvements may also apply to other multi-access technologies and the telecommunication standards that employ these technologies.

SUMMARY

In one embodiment, a method is performed by an RF communication assembly including an RF communication circuit and a compensator apparatus. The method includes the step of the compensator apparatus receiving an input, where the input includes an I-component of a pre-compensated signal, a Q-component of the pre-compensated signal, and encoded operating conditions of the RF communication circuit. The RF communication circuit includes RF circuit components causing signal impairments. The method further includes the steps of the compensator apparatus performing neural network computing on the input; and the RF communication assembly generating a compensated output signal that compensates for at least a portion of the signal impairments.

In another embodiment, an RF communication assembly includes an RF communication circuit that further includes RF circuit components causing signal impairments. The RF communication assembly also includes processing hardware that further includes a compensator apparatus. The processing hardware is operative to receive, by the compensator apparatus, an input including an I-component of a pre-compensated signal, a Q-component of the pre-compensated signal, and encoded operating conditions of the RF communication circuit; and perform neural network computing on the input. The RF communication assembly is operative to generate a compensated output signal that compensates for at least a portion of the signal impairments.

Other aspects and features will become apparent to those ordinarily skilled in the art upon review of the following description of specific embodiments in conjunction with the accompanying figures.

BRIEF DESCRIPTION OF THE DRAWINGS

The present invention is illustrated by way of example, and not by way of limitation, in the figures of the accompanying drawings in which like references indicate similar elements. It should be noted that different references to "an" or "one" embodiment in this disclosure are not necessarily to the same embodiment, and such references mean at least one. Further, when a particular feature, structure, or characteristic is described in connection with an embodiment, it is submitted that it is within the knowledge of one skilled in the art to effect such feature, structure, or characteristic in connection with other embodiments whether or not explicitly described.

DETAILED DESCRIPTION

Figure 1A:
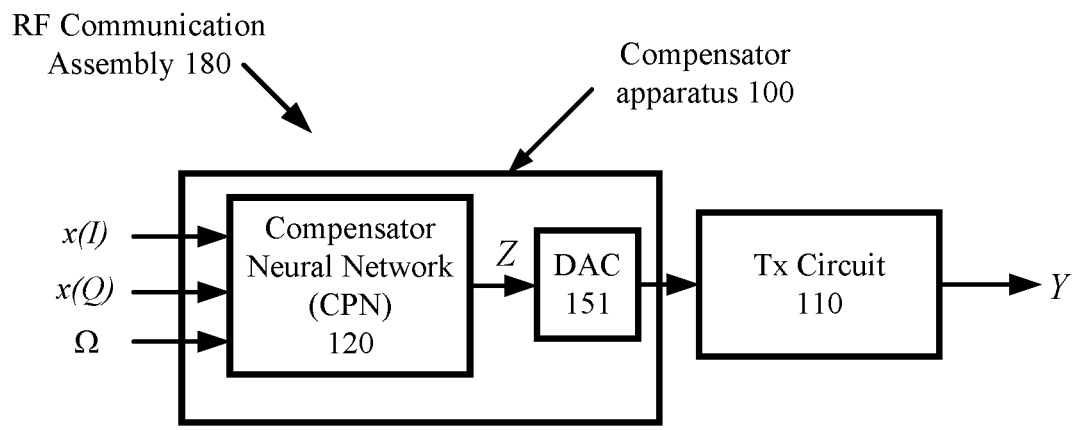
FIG. 1A is a block diagram of an RF communication assembly including an RF transmitter (Tx) circuit and a compensator neural network (CPN) according to one embodiment.

In the following description, numerous specific details are set forth. However, it is understood that embodiments of the invention may be practiced without these specific details. In other instances, well-known circuits, structures, and techniques have not been shown in detail in order not to obscure the understanding of this description. It will be appreciated, however, by one skilled in the art, that the invention may be practiced without such specific details. Those of ordinary skill in the art, with the included descriptions, will be able to implement appropriate functionality without undue experimentation.

Embodiments of the invention provide an artificial intelligence (AI) based method and system to compensate for impairments caused by an RF communication circuit, e.g., an RF transmitter (Tx) circuit, an RF receiver (Rx) circuit, etc. The RF communication circuit described herein includes multiple RF circuit components, e.g., filters, mixers, local oscillators, RF amplifiers, baseband amplifiers. These RF circuit components cause multiple types of signal impairments such as I-Q gain asymmetry, frequency-dependent I-Q mismatch (FDIQ), frequency-independent I-Q mismatch (FIIQ), nonlinearity, direct current (DC) offset, etc. Calibrating each of these circuit components independently is not only time-consuming but also inefficient due to the large amount of calibration data needed. Furthermore, per-component calibration may produce a local optimization for each component, but the aggregation of the local optimizations may not produce a global optimization for the entire RF communication circuit.

The AI-based method and system disclosed herein utilize neural networks to compensate for the aforementioned impairments. Initially, an emulator neural network is trained to emulate the characteristics of a multi-component RF communication circuit. For an RF Tx circuit (also referred to as "Tx circuit"), a compensator neural network is connected to an input end of the trained emulator neural network and is trained to compensate for the impairments caused by the Tx circuit. For an RF Rx circuit (also referred to as "Rx circuit"), a compensator neural network is connected to an output end of the trained emulator neural network and is trained to compensate for the impairments caused by the Rx circuit.

In the following description unless otherwise stated, a signal that includes both an in-phase signal component and a quadrature signal component is represented by an upper-case letter. Each of the in-phase signal component and the quadrature signal component is represented by a lower-case letter. For example, signal $X=x(I)+x(Q)$, and signal $V=v(I)+v(Q)$. Furthermore, to simplify the notations, an analog signal and its corresponding digital signal are represented by the same letter. For example, digital signal Z after the digital-to-analog conversion is still represented by Z, and analog signal V after the analog-to-digital conversion is still represented by V.

FIG. 1A is a block diagram of an RF communication assembly 180 according to one embodiment. The RF communication assembly 180 includes a compensator apparatus 100 performing open-loop compensation for impairments caused by a Tx circuit 110 according to one embodiment. In this embodiment, the Tx circuit 110 is a multi-component RF communication circuit. The compensator apparatus 100 includes a compensator neural network (CPN) 120 coupled to the input of the Tx circuit 110. The CPN 120 has been trained to compensate for the impairments caused by the Tx circuit 110. The digital output (Z) of the CPN 120 is converted by a DAC 151 into an analog signal, which is input to the Tx circuit 110 to generate a compensated output signal (Y).

In one embodiment, the CPN 120 receives a first time sequence data, which is the pre-compensated in-phase data $x(I)$, and a second time sequence data, which is the pre-compensated quadrature data $x(Q)$. Additionally, the CPN 120 receives encoded operating conditions $\Omega$ of the Tx circuit 110. The operating conditions include, but are not limited to, power, modulation and coding scheme (MCS), frequency, channel bandwidth (CBW), resource block (RB), and temperature of the Tx circuit 110. In one embodiment, the operating conditions are encoded and concatenated with $x(I)$ and $x(Q)$ at the input layer of the CPN 120. Alternatively, the operating conditions are encoded and processed by the CPN 120 in a channel separate from the $x(I)$ and $x(Q)$ channels. In this embodiment, the compensation performed by the CPN 120 is open-loop because there is no feedback from the output end of the Tx circuit 110.

The training of the CPN 120 will be described later with reference to FIG. 5A. During the inference phase, the trained CPN 120 receives an input signal $X=(x(I), x(Q))$ and the encoded operating condition $\Omega$ of the Tx circuit 110, and generates a pre-distorted signal Z. For each time instant t, the output signal Y(t) is generated from a time sequence of input signal X(t–p: t), where p is a configurable value.

Figure 1B:
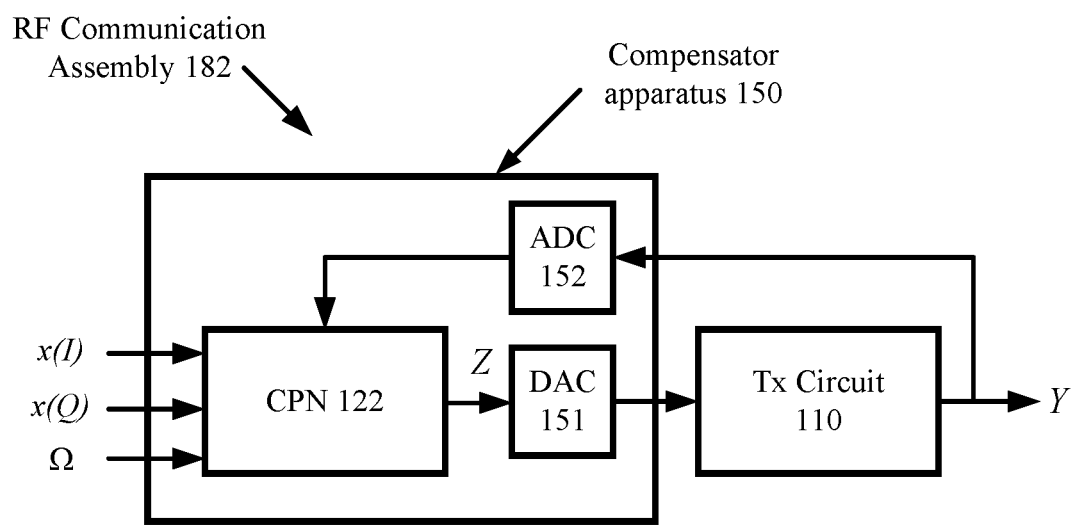
FIG. 1B is a block diagram of an RF communication assembly including an RF Tx circuit and a CPN according to another embodiment.

FIG. 1B is a block diagram of an RF communication assembly 182 according to one embodiment. The RF communication assembly 182 includes a compensator apparatus 150 performing closed-loop compensation for impairments caused by the Tx circuit 110. The compensator apparatus 150 includes a CPN 122 coupled to the input of the Tx circuit 110. The CPN 122 receives the input signal $X=(x(I), x(Q))$ and the encoded operating condition $\Omega$ of the Tx circuit 110, and generates a pre-distorted signal Z. In this embodiment, the output of the Tx circuit 110 is converted by the ADC 152 and fed back to the CPN 122. Thus, the CPN 122 may update its parameters (such as filter weights and biases) during the inference phase to generate a next output signal. In one embodiment, the update may be based on the difference between the input to the CPN 122 (i.e., the ground truth X) and the output of the Tx circuit 110 (i.e., the feedback Y).

Figure 2A:
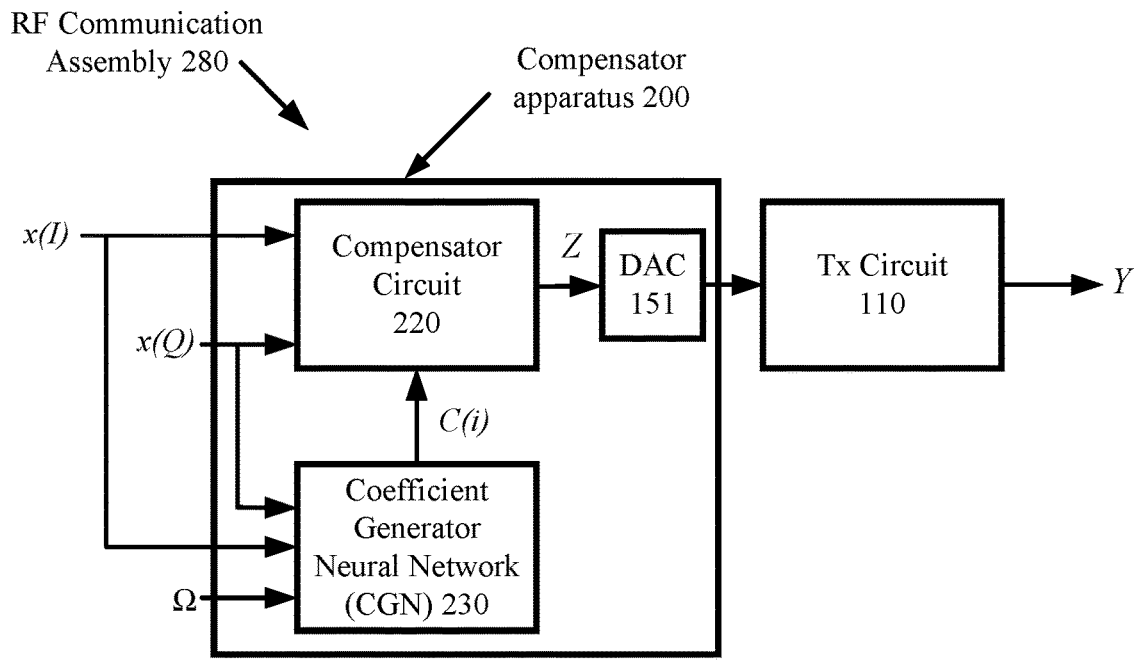
FIG. 2A is a block diagram of an RF communication assembly including an RF Tx circuit and a coefficient generator neural network (CGN) according to one embodiment.

FIG. 2A is a block diagram of an RF communication assembly 280 according to one embodiment. The RF communication assembly 280 includes a compensator apparatus 200 performing open-loop compensation for impairments caused by the Tx circuit 110. In this embodiment, the compensator apparatus 200 includes a compensator circuit 220 coupled to the input of the Tx circuit 110. In one embodiment, the compensator circuit 220 includes a filter with configurable filter coefficients. The compensator apparatus 200 further includes a coefficient generator neural network (CGN) 230 that is trained to generate filter coefficients C(i)'s for the compensator circuit 220, where i is a running index for a total of N filter coefficients. The training of the CGN 230 will be described later with reference to FIG. 5A.

The CGN 230 receives the input signal $X=(x(I), x(Q))$ and the encoded operating conditions $\Omega$ of the Tx circuit 110, and generates filter coefficients C(i)'s. The encoded operating conditions may be concatenated with $x(I)$ and $x(Q)$ at the input layer of the CGN 230, or processed by the CGN 230 in a channel separate from the $x(I)$ and $x(Q)$ channels.

In one embodiment, the output (Z) of the compensator circuit 220 is converted into an analog signal by the DAC 151 and input to the Tx circuit 110. At each time instant t, the Tx circuit 110 generates an output signal Y(t) from the time sequence of input signal X(t–p: t), where p is a configurable value.

Figure 2B:
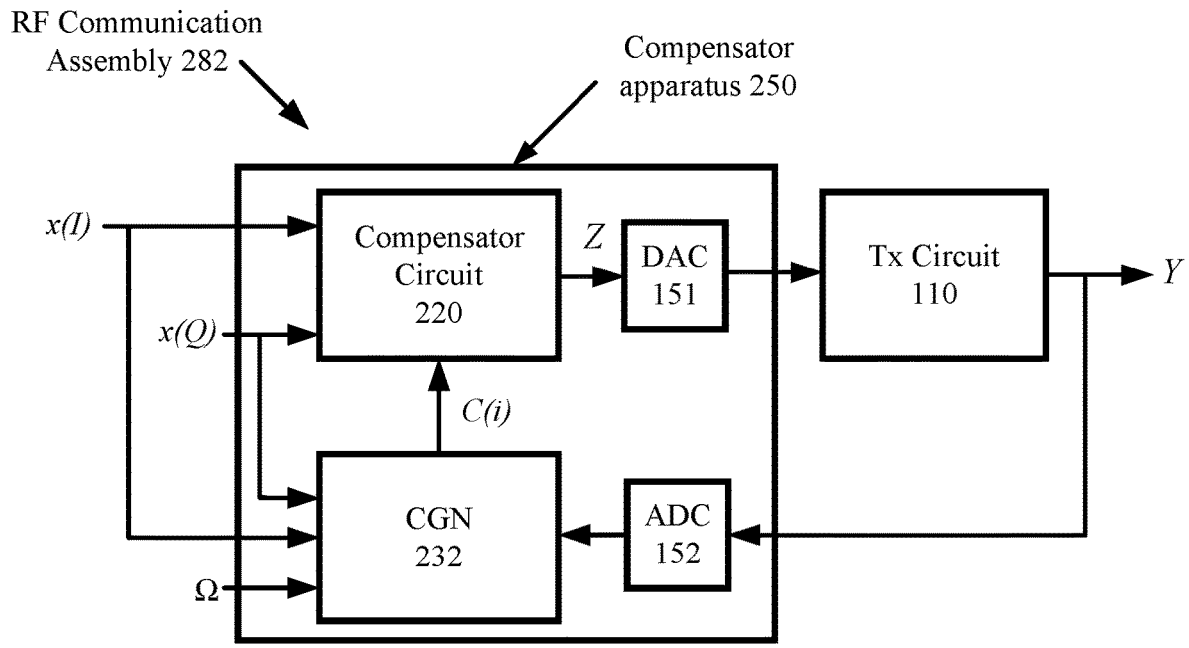
FIG. 2B is a block diagram of an RF communication assembly including an RF Tx circuit and a CGN according to another embodiment.

FIG. 2B is a block diagram of an RF communication assembly 282 according to one embodiment. The RF communication assembly 282 includes a compensator apparatus 250 performing closed-loop compensation for impairments caused by the Tx circuit 110. The compensator apparatus 250 includes the compensator circuit 220 and further includes a CGN 232 that is trained to generate filter coefficients C(i)'s for the compensator circuit 220, where i is a running index for a total of N filter coefficients.

The CGN 232 receives the input signal X=(x(I), x(Q)) and the encoded operating conditions Ω of the Tx circuit 110, and generates filter coefficients C(i)'s for the compensator circuit 220. In this embodiment, the output of the Tx circuit 110 is converted by the ADC 152 and fed back to the CGN 232. Thus, the CGN 232 may update its parameters (such as filter weights and biases) during the inference phase. In one embodiment, the update may be based on the difference between the input to the CGN 232 (i.e., the ground truth X) and the output of the Tx circuit 110 (i.e., the feedback Y).

Figure 3:
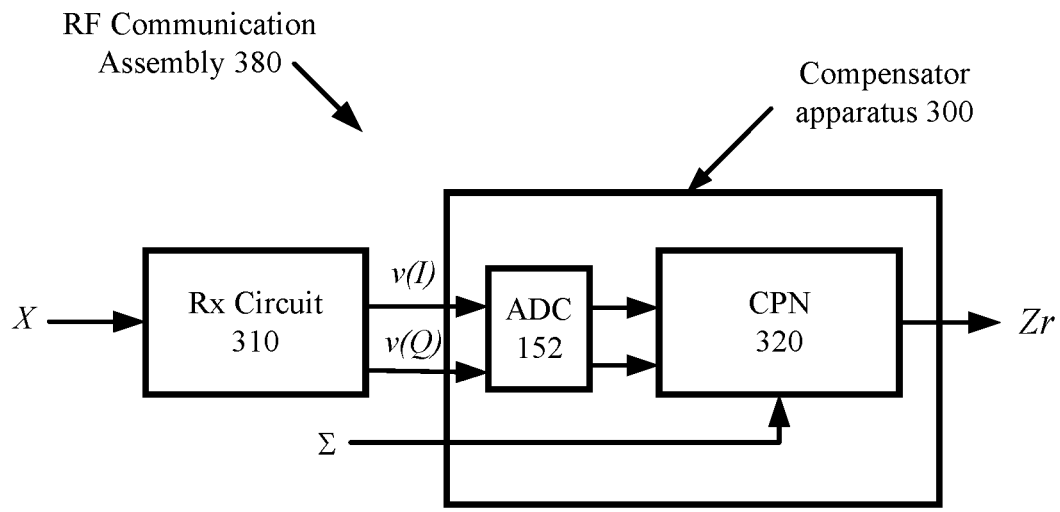
FIG. 3 is a block diagram of an RF communication assembly including an RF receiver (Rx) circuit and a CPN according to one embodiment.

FIG. 3 is a block diagram of an RF communication assembly 380 according to one embodiment. The RF communication assembly 380 includes a compensator apparatus 300 that compensates for the impairments caused by an Rx circuit 310. In this embodiment, the Rx circuit 310 is a multi-component RF communication circuit. The compensator apparatus 300 includes a CPN 320 coupled to the output of the Rx circuit 310. The Rx circuit 310 receives input signal X=(x(I), x(Q)) and outputs an impaired signal V=(v(I), v(Q)). The impaired signal V is converted into a digital signal by the ADC 152. The CPN 320 receives the digital signal and generates a compensated output signal Zr.

In one embodiment, the CPN 320 also receives the encoded operating conditions Σ of the Rx circuit 310. The encoded operating conditions include, but are not limited to, power, MCS, frequency, CBW, RB, and temperature of the Rx circuit 310. The encoded operating conditions may be concatenated with v(I) and v(Q) at the input layer of the CPN 320, or processed by the CPN 320 in a channel separate from the v(I) and v(Q) channels. The training of the CPN 320 will be described later with reference to FIG. 5B.

Figure 4:
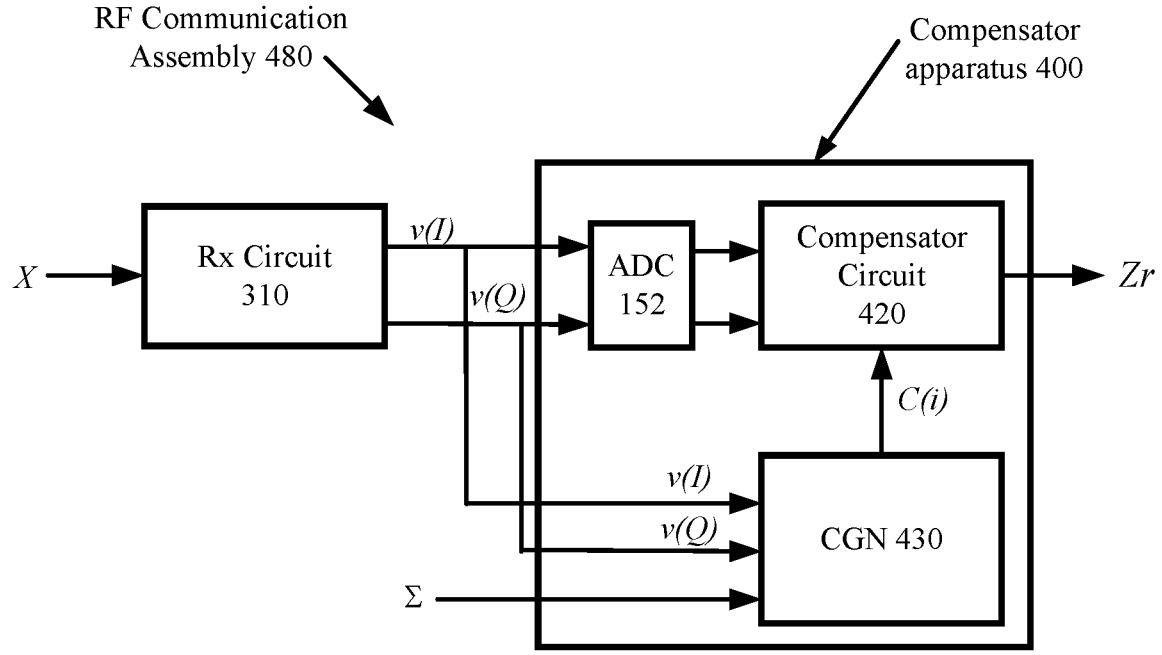
FIG. 4 is a block diagram of an RF communication assembly including an RF Rx circuit and a CGN according to one embodiment.

FIG. 4 is a block diagram of an RF communication assembly 480 according to one embodiment. The RF communication assembly 480 includes a compensator apparatus 400 that compensates for the impairments caused by the Rx circuit 310. The compensator apparatus 400 includes a compensator circuit 420 coupled to the output of the Rx circuit 310. The output (V) of the Rx circuit 310 is converted into a digital signal by the ADC 152. The compensator circuit 420 receives the digital signal and generates a compensated output signal Zr. In one embodiment, the compensator circuit 420 includes a filter with configurable filter coefficients. The compensator apparatus 400 further includes a CGN 430 that is trained to generate filter coefficients C(i)'s for the compensator circuit 420, where i is a running index for a total of N filter coefficients. The training of the CGN 430 will be described later with reference to FIG. 5B.

The CGN 430 receives input signal V=(v(I), v(Q)) and encoded operating conditions Σ of the Rx circuit 310, and generates filter coefficients C(i)'s. The operating conditions Σ have been described in connection with FIG. 3. The encoded operating conditions may be concatenated with v(I) and v(Q) at the input layer of the CGN 430, or processed by the CGN 430 in a channel separate from the v(I) and v(Q) channels.

Figure 5A:
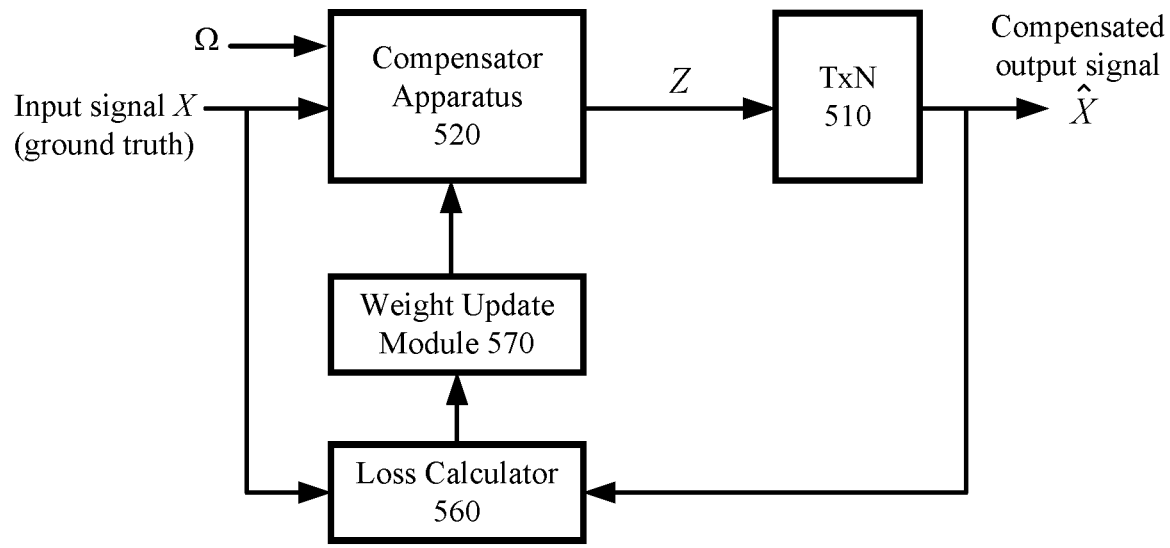
FIG. 5A is a block diagram illustrating a system for training a compensator apparatus according to one embodiment.

FIG. 5A is a block diagram illustrating a system for training a compensator apparatus 520 according to one embodiment. In some embodiments, the compensator apparatus 520 may be the compensator apparatus 100 (FIG. 1A), 150 (FIG. 1B), 200 (FIG. 2A), or 250 (FIG. 2B).

Referring also to FIGS. 1A, 1B, 2A, and 2B, the training of the compensator apparatus 520 includes two stages. In the first stage, an emulator neural network (referred to as a TxN neural network or a TxN 510) is trained to emulate the Tx circuit 110, e.g., to model the input and output of the Tx circuit 110 and the impairments caused by the Tx circuit 110.

After training the TxN 510, its parameters (e.g., filter weights and biases) are fixed and used in the second training stage to train the neural network (e.g., the CPN 120 or 122, or the CGN 330 or 332) in the compensator apparatus 520. The neural network is trained to optimize a multi-objective loss function. In one embodiment, the TxN 510 and the neural network may be trained to optimize the same multi-objective loss function or two different multi-objective loss functions.

The training data for the TxN 510 may be obtained from multiple Tx circuits (also referred to as "real Tx circuits") with different operating conditions and/or physical characteristics. The input training data includes the in-phase time sequence data x(I), the quadrature time sequence data x(Q), and encoded operating conditions of the real Tx circuit emulated by the TxN 510. The same input training data is fed into the TxN 510 and the real Tx circuit. The losses are measured in terms of the difference between the real Tx circuit's output and the TxN's output. After the TxN 510 is trained and its filter weights are fixed, the trained TxN 510 is connected to the output of the compensator apparatus 520. When training the compensator apparatus 520, the input to the compensator apparatus 520 is the ground truth and the losses are measured in terms of the difference between this ground truth and the TxN's output.

Figure 5B:
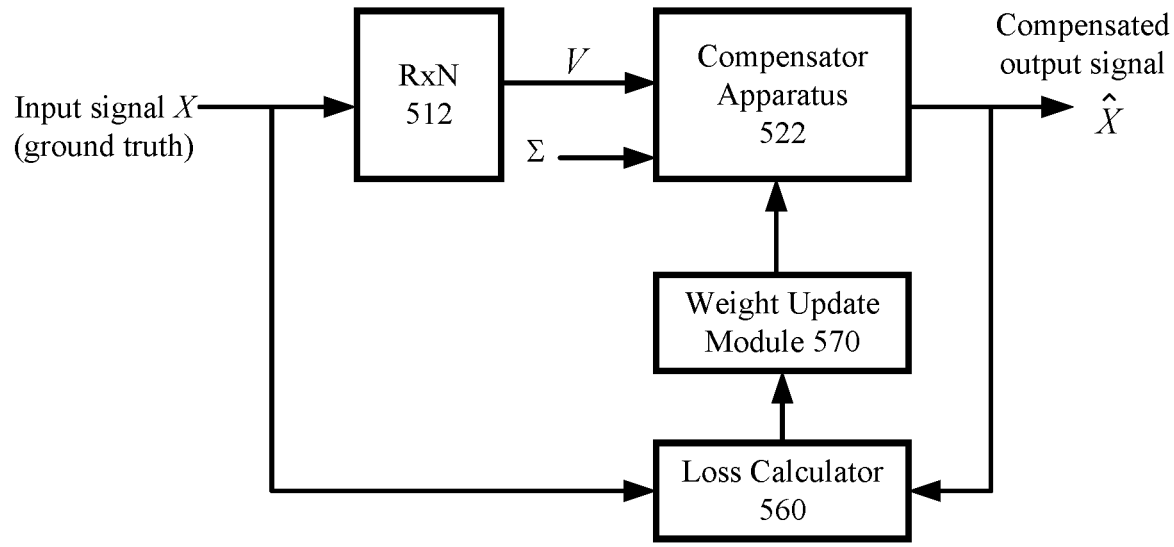
FIG. 5B is a block diagram illustrating a system for training a compensator apparatus according to another embodiment.

FIG. 5B is a block diagram illustrating a system for training a compensator apparatus 522 according to one embodiment. In some embodiments, the compensator apparatus 522 may be the compensator apparatus 300 (FIG. 3) or 400 (FIG. 4).

Referring also to FIGS. 3 and 4, the training of the compensator apparatus 522 includes two stages. In the first stage, an emulator neural network (referred to as an Rx neural network or an RxN 512) is trained to emulate the Rx circuit 310, e.g., to model the input and output of the Rx circuit 310 and the impairments caused by the Rx circuit 310. After training the RxN 512, its parameters (e.g., filter weights and biases) are fixed and used in the second training stage to train the neural network (e.g., the CPN 320 or the CGN 430) in the compensator apparatus 522. The neural network is trained to optimize a multi-objective loss function. In one embodiment, the RxN 512 and the neural network may be trained to optimize the same multi-objective loss function or two different multi-objective loss functions.

The training data for the RxN 512 may be obtained from multiple Rx circuits (also referred to as "real Rx circuits") with different operating conditions and/or physical characteristics. The training process of the RxN 512 is similar to that of the TxN 510 and is not repeated. When training the compensator apparatus 522, the input to the compensator apparatus 522 is the ground truth and the losses are measured in terms of the difference between this ground truth and the output of the compensator apparatus 522.

During the second-stage training in the embodiments of FIGS. 5A and 5B, a loss calculator 560 calculates a multi-objective loss function that measures the difference between the input signal x and the compensated output signal $\hat{x}$ (both x and $\hat{x}$ are complex signals). The loss calculator 560 may adjust either x and $\hat{x}$ to account for any frequency-domain filtering and conversion performed by the circuit components in the Tx or Rx circuit and emulated by the TxN 510 or the RxN 512. Amplitude normalization is also applied to the signals before the loss is calculated.

During training, a weight update module 570 updates the neural network weights based on a gradient with respect to the neural network weights. As an example, the weight update module 570 may implement a gradient-based optimization algorithm such as the Adam algorithm (Kingma et al., ADAM: a method for stochastic optimization, arXiv: 1412.6980).

The multi-objective loss function may be a combination of one or more time-domain losses (e.g., mean square error (MSE), error vector magnitude (EVM)) and one or more frequency-domain losses (e.g., mean absolute error (MAE), specification loss based on the adjacent channel leakage power ratio (ACLR)). The multi-objective loss function used in the training of the TxN 510, the RxN 520, and the compensators 520 and 522 may include the same or a different combination of the aforementioned losses.

In one embodiment, the multi-objective loss function may include a time-domain loss such as the mean square error (MSE) between two signals x and x̂. The MSE can be formulated as follows:

$$\text{loss}_{tMSE}(x,\hat{x})=\log \Sigma \|x-\hat{x}\|_2$$

In the Fourier-transformed spectrum domain, each complex number in an interval represents a specific frequency range. The absolute value describes power magnitude in the specific frequency point. Because the power magnitude of the transmitted signal is generally larger than the out-of-band signal, the mean absolute error (MAE) may be used instead of, or in addition to, the time-domain loss MSE to avoid over biasing on the in-band signals. Thus, the multi-objective loss function may include a frequency-domain loss such as the MAE between the STFT of x and the STFT of x̂, where STFT stands for Short Time Fourier Transform which is applied on both x and x̂. The MAE can be formulated as follows:

$$\text{loss}_{fMAE}(x,\hat{x})=\log \Sigma \|\text{STFT}(x)-\text{STFT}(\hat{x})\|_1$$

Instead of or in addition to the aforementioned losses, the multi-objective loss function may include a frequency-domain loss such as the specification loss computed from the adjacent channel leakage power ratio (ACLR). According to the 3GPP specification, ACLR is the ratio of the filtered mean power centered on the assigned channel frequency (i.e., in-band frequency) to the filtered mean power centered on an adjacent channel frequency (i.e., out-of-band frequency). The specification loss is defined to minimize the ACLR difference between x and x̂. The formulations of ACLR and the specification loss are as follows:

$$ACLR(x) = \log\left(\frac{\sum_{in\_land}|STFT(x)|^2}{\sum_{out\_land}|STFT(x)|^2}\right)$$

$$\text{loss}_{fSPEC}(x, \hat{x}) = |ACLR(x) - ACLR(\hat{x})|$$

Instead of or in addition to the aforementioned losses, the multi-objective loss function may include a time-domain loss such as the error vector magnitude (EVM). The EVM measures how far the constellation points of a signal deviate from the ideal locations, e.g., the difference (i.e., error vectors) between the compensated output signal x̂ symbols and ideal quadrature amplitude modulation (QAM) symbols. The EVM may be calculated as the root mean square (RMS) average amplitude of the error vectors, normalized to an ideal signal amplitude reference. Methods for measuring a transmitter's EVM are known in the art. EVM can be used to quantify the performance loss in the compensated output signal and can be optimized during training of the compensator 520.

In one embodiment, operations of the loss calculator 560 and the weight update module 570 may be performed by a general-purpose processor, specialized hardware, or an accelerator for training neural networks.

Figure 6:
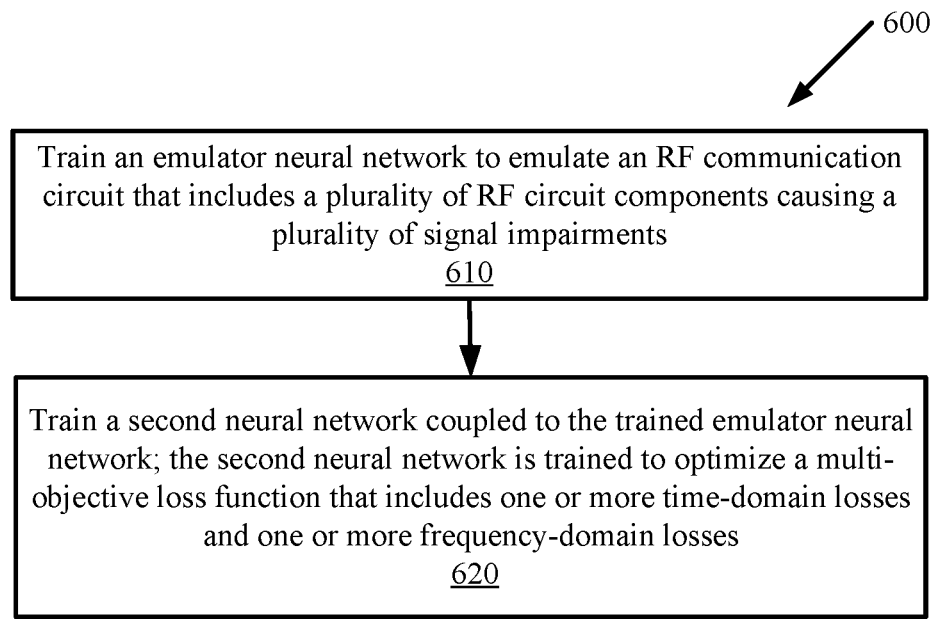
FIG. 6 is a flow diagram illustrating a method for training a compensator apparatus according to one embodiment.

FIG. 6 is a flow diagram illustrating a method 600 for training a compensator apparatus according to one embodiment. Method 600 may be performed by a system in which the RF communication circuit (e.g., the Tx circuit 110 and/or the Rx circuit 210) is located, or by a system (e.g., a server computer) from which the trained compensator can be downloaded. The compensator apparatus may be the compensator apparatus 520 in FIG. 5A or the compensator apparatus 522 in FIG. 5B.

Method 600 starts at step 610 when a system trains an emulator neural network to emulate an RF communication circuit that includes multiple RF circuit components causing multiple signal impairment. The system at step 620 trains a second neural network (e.g., a compensator apparatus) that is coupled to the trained emulator neural network. The second neural network is trained to optimize a multi-objective loss function that includes one or more time-domain losses and one or more frequency-domain losses.

Figure 7:
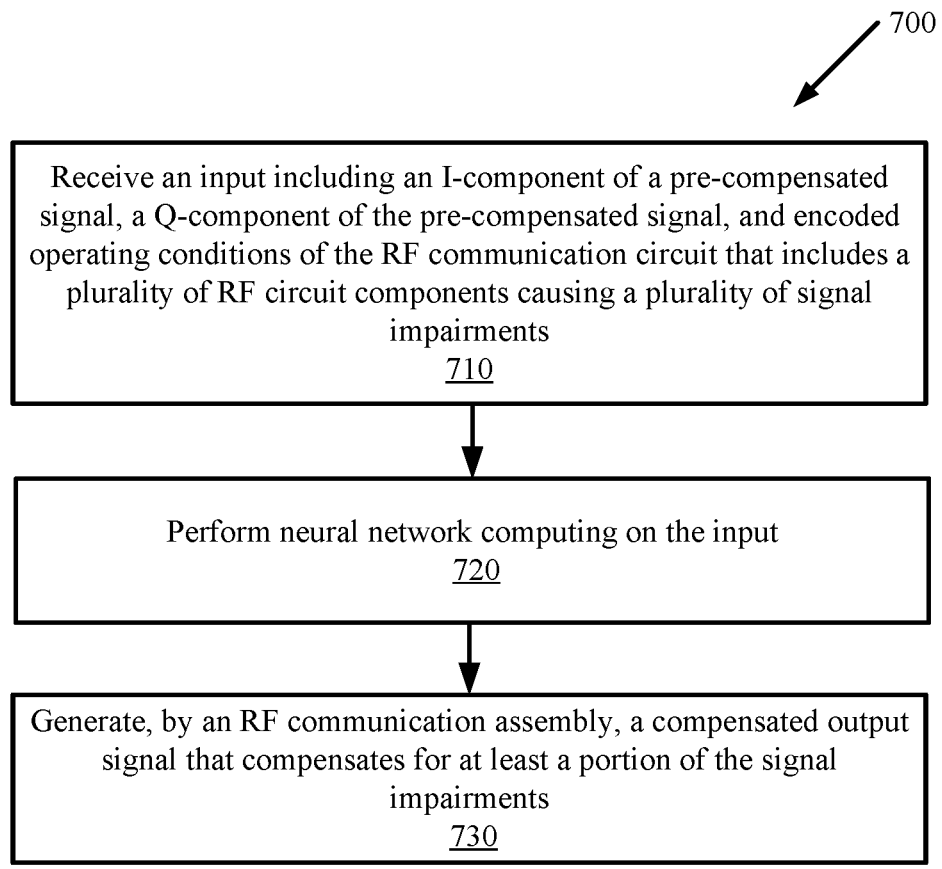
FIG. 7 is a flow diagram illustrating a method for compensating for the impairments caused by an RF communication circuit according to one embodiment.

FIG. 7 is a flow diagram illustrating a method 700 for compensating for the impairments caused by an RF communication circuit according to one embodiment. Method 700 may be performed by a system in which the RF communication circuit (e.g., the Tx circuit 110 and/or the Rx circuit 210) is located. More specifically, method 700 may be performed by an RF communication assembly, e.g., any RF communication assembly described in connection with FIGS. 1A, 1B, 2A, 2B, 3, and 4.

Method 700 starts at step 710 when a compensator apparatus receives an input including an I-component of a pre-compensated signal, a Q-component of the pre-compensated signal, and encoded operating conditions of an RF communication circuit. The RF communication circuit includes multiple RF components causing multiple signal impairments. The compensator apparatus at step 720 performs neural network computing on the input. At step 730, the RF communication assembly generates a compensated output signal that compensates for at least a portion of the signal impairments.

In one embodiment, the RF communication circuit includes an RF Tx circuit having an input end coupled to the compensator apparatus. In another embodiment, the RF communication circuit includes an RF Rx circuit having an output end coupled to the compensator apparatus.

In one embodiment, the compensator apparatus includes a CPN operative to generate the compensated output signal or an output signal to an RF Tx circuit based on the input. In another embodiment, the compensator apparatus includes a CGN and a compensator circuit. The CGN is operative to generate filter coefficients based on the input, and the compensator circuit is operative to generate the compensated output signal or an output signal to an RF Tx circuit based on the filter coefficients.

In one embodiment, the encoded operating conditions include one or more of: power, MCS, frequency, CBW, RB, and temperature of the RF communication circuit. In one embodiment, the compensator apparatus is operative to receive the compensated output signal an output of the RF Tx circuit as a feedback signal to generate a next compensated output signal.

In one embodiment, an emulator neural network is trained to emulate the RF communication circuit. Then a second neural network coupled to the emulator neural network is trained to optimize a multi-objective loss function that includes one or more time-domain losses and one or more frequency-domain losses. The one or more frequency-domain losses may include one or more of: a frequency-domain specification loss and a frequency-domain MAE. The frequency-domain specification loss is a difference between an adjacent channel leakage power ratio (ACLR) of a ground truth and an ACLR of the compensated output signal, wherein the ACLR is a ratio of filtered mean power centered on an assigned channel frequency to filtered mean power centered on an adjacent channel frequency. The frequency-domain MAE is calculated from a difference between Short Time Fourier Transform (STFT) of the ground truth and STFT of the compensated output signal.

The one or more time-domain losses may include one or more of: a time-domain MSE calculated from a difference between a ground truth and the compensated output signal, and a time-domain error vector magnitude (EVM) calculated from a difference between the compensated output signal's symbols and ideal QAM symbols.

Figure 8:
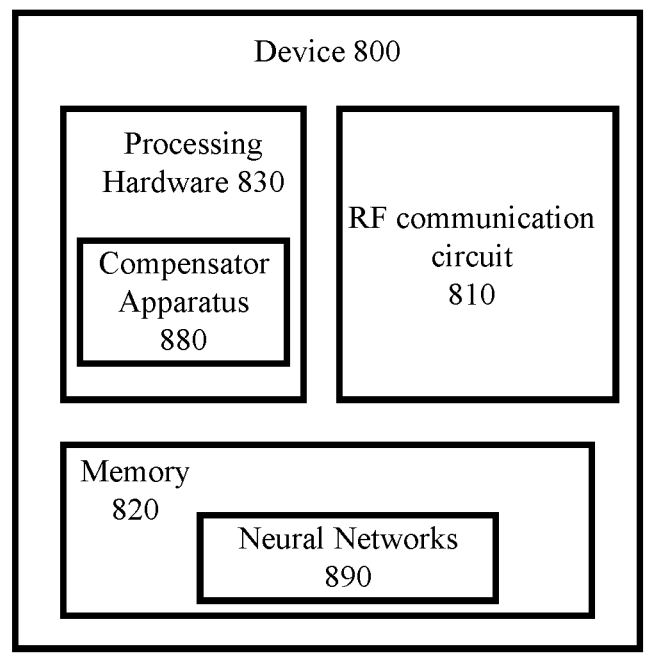
FIG. 8 is a block diagram illustrating a device that includes a compensator apparatus according to one embodiment.

FIG. 8 is a diagram illustrating a device 800 according to one embodiment. The device 800 may be a wireless device. The device 800 includes processing hardware 830, which can include any general-purpose and/or special-purpose computing circuitry, such as a central processing circuit (CPU), a graphics processing unit (GPU), a digital signal processor (DSP), a media processor, a neural processing circuit (NPU), AI accelerator, application-specific integrated circuit (ASIC), or the like. In one embodiment, the processing hardware 830 may evaluate the aforementioned multi-objective loss function and neural network weight updates during the training phase and the inference phase of a neural network, such as any of the aforementioned neural networks.

The device 800 further includes a memory 820. The memory 820 may include on-chip and off-chip memory devices such as dynamic random access memory (DRAM), static RAM (SRAM), flash memory, and other volatile or non-volatile memory devices. The memory 820 may store one or more neural networks 890, such as any of the aforementioned neural networks for RF impairment compensations. The memory 820 may include instructions, which when executed by the processing hardware 810, cause the processing hardware 810 to perform the training phase and the inference phase of the neural networks 890.

The neural networks 890 described herein may include one or more of a fully-connected network (FC), a convolutional neural network (CNN), a recurrent neural network (RNN), a graph neural network (GNN), a self-attestation-based network such as a transformer, and the like. A non-limiting example of a neural network is a CNN composed of 6 convolution layers with an input sequence of 128 sample points (input length). In each sample, two input channels are used for I and Q, and the output channel number for each layer is 16-32-64-64-128-2. Except for the last output layer, each convolution layer is followed by a batch normalization layer and PReLU activation function.

The device 800 also includes an RF communication circuit 810 that includes multiple circuit components. The RF communication circuit 810 may be a Tx circuit and/or an Rx circuit. Impairments caused by the RF communication circuit 810 can be compensated by a compensator apparatus 880, which may be any of the aforementioned compensator apparatuses. In one embodiment, the compensator apparatus 880 may include general-purpose or specialized hardware to perform neural network operations. In an alternative embodiment, the compensator apparatus 880 may include instructions, which when executed by the processing hardware 810, cause the processing hardware 810 to perform neural network operations for RF impairment compensations. It is understood the embodiment of FIG. 8 is simplified for illustration purposes. Additional hardware components may be included.

Referring to FIGS. 1B, 2B, 2A, 2B, 3, and 4, one or more of the compensator apparatuses disclosed therein may be implemented in hardware circuitry, software executed by hardware circuitry, or a combination of hardware and software. The hardware circuitry may be special-purpose or general-purpose hardware. Software may be stored on any non-transitory computer-readable medium for use by the device 800 or by methods executed by the device 800.

Various functional components, blocks, or modules have been described herein. As will be appreciated by persons skilled in the art, the functional blocks or modules may be implemented through circuits (either dedicated circuits or general-purpose circuits, which operate under the control of one or more processors and coded instructions), which will typically comprise transistors that are configured in such a way as to control the operation of the circuitry in accordance with the functions and operations described herein.

While the invention has been described in terms of several embodiments, those skilled in the art will recognize that the invention is not limited to the embodiments described, and can be practiced with modification and alteration within the spirit and scope of the appended claims. The description is thus to be regarded as illustrative instead of limiting.

What is claimed is:

1. A method of training a compensator apparatus to compensate for signal impairments caused by a radio frequency (RF) transmitter (Tx) circuit, comprising:
 performing a first training stage to train an emulator neural network to emulate a plurality of Tx circuits in different operating conditions, wherein, for each of the Tx circuits, performing the first training stage further comprises:
  sending a first input to the Tx circuit and the emulator neural network to receive respective output signals; and
  updating weights and biases of the emulator neural network based on a first loss function, the first loss function calculated from a first difference between the respective output signals of the Tx circuit and the emulator neural network; and
 performing a second training stage subsequent to the first training stage to train a neural network in the compensator apparatus while keeping the weights and the biases of the emulator neural network fixed, wherein performing the second training stage further comprises:
  sending a given signal to the neural network, which causes the compensator apparatus to generate an input signal to the emulator neural network; and
  updating weights and biases of the neural network based on a second loss function, the second loss function calculated from a second difference between the given signal and a compensated output signal from the emulator neural network.

2. The method of claim 1, wherein the different operating conditions include one or more of: power, modulation and coding scheme (MCS), frequency, channel bandwidth (CBW), resource block (RB), and temperature of the RF communication circuit.

3. The method of claim 1, further comprising:
 receiving, by the neural network in an inference stage, an output of the RF Tx circuit as a feedback signal to generate a next pre-distorted output signal.

4. The method of claim 1,
wherein at least of one of the first loss function and the second loss function is a multi-objective loss function that includes one or more time-domain losses and one or more frequency-domain losses.

5. The method of claim 4, wherein the one or more frequency-domain losses include a frequency-domain specification loss, which is a difference between an adjacent channel leakage power ratio (ACLR) of the given signal and an ACLR of the compensated output signal, wherein the ACLR is a ratio of filtered mean power centered on an assigned channel frequency to filtered mean power centered on an adjacent channel frequency.

6. The method of claim 4, wherein the one or more time-domain losses include one or more of: a time-domain mean square error (MSE) calculated from a difference between the given signal and the compensated output signal, and a time-domain error vector magnitude (EVM) calculated from a difference between the compensated output signal's symbols and ideal quadrature amplitude modulation (QAM) symbols.

7. The method of claim 4, wherein the one or more frequency-domain losses include a frequency-domain mean absolute error (MAE), which is calculated from a difference between Short Time Fourier Transform (STFT) of the given signal and STFT of the compensated output signal.

8. The method of claim 1, wherein the neural network in the compensator apparatus is a compensator neural network (CPN), the method further comprises:
generating, by the CPN in an inference stage, a pre-distorted signal to send to the RF Tx circuit.

9. The method of claim 1, wherein the neural network in the compensator apparatus is a coefficient generator neural network (CGN), the method further comprises:
generating, by the CGN in an inference stage, filter coefficients to send to a compensator circuit in the compensator apparatus; and
generating, by the compensator circuit, a pre-distorted signal to the RF Tx circuit based on the filter coefficients.

10. The method of claim 1, wherein sending the given signal to the neural network further comprises:
sending the given signal with information of operating conditions of the RF Tx circuit to the neural network.

11. A method of training a compensator apparatus to compensate for signal impairments caused by a radio frequency (RF) receiver (Rx) circuit, comprising:
performing a first training stage to train an emulator neural network to emulate a plurality of Rx circuits in different operating conditions, wherein, for each of the Rx circuits, performing the first training stage further comprises:
sending a first input to the Rx circuit and the emulator neural network to receive respective output signals; and
updating weights and biases of the emulator neural network based on a first loss function, the first loss function calculated from a first difference between the respective output signals of the Rx circuit and the emulator neural network; and
performing a second training stage subsequent to the first training stage to train a neural network in the compensator apparatus while keeping the weights and the biases of the emulator neural network fixed, wherein performing the second training stage further comprises:
sending a given signal to the emulator neural network, which generates an input signal to the neural network; and
updating weights and biases of the neural network based on a second loss function, the second loss function calculated from a second difference between the given signal and a compensated output signal from the compensator apparatus.

12. The method of claim 11, wherein the different operating conditions include one or more of: power, modulation and coding scheme (MCS), frequency, channel bandwidth (CBW), resource block (RB), and temperature of the RF communication circuit.

13. The method of claim 11, wherein at least of one of the first loss function and the second loss function is a multi-objective loss function that includes one or more time-domain losses and one or more frequency-domain losses.

14. The method of claim 13, wherein the one or more frequency-domain losses include a frequency-domain specification loss, which is a difference between an adjacent channel leakage power ratio (ACLR) of the given signal and an ACLR of the compensated output signal, wherein the ACLR is a ratio of filtered mean power centered on an assigned channel frequency to filtered mean power centered on an adjacent channel frequency.

15. The method of claim 13, wherein the one or more time-domain losses include a time-domain mean square error (MSE) calculated from a difference between the given signal and the compensated output signal.

16. The method of claim 13, wherein the one or more frequency-domain losses include a frequency-domain mean absolute error (MAE), which is calculated from a difference between Short Time Fourier Transform (STFT) of the given signal and STFT of the compensated output signal.

17. The method of claim 13, wherein the one or more time-domain losses include a time-domain error vector magnitude (EVM) calculated from a difference between the compensated output signal's symbols and ideal quadrature amplitude modulation (QAM) symbols.

18. The method of claim 11, wherein the neural network in the compensator apparatus is a compensator neural network (CPN), the method further comprises:
receiving, by the CPN in an inference stage, an impaired signal from the RF Rx circuit; and
generating, by the CPN, the compensated output signal based on the impaired signal.

19. The method of claim 11, wherein the neural network in the compensator apparatus is a coefficient generator neural network (CGN), the method further comprises:
receiving, by the CGN in an inference stage, an impaired signal from the RF Rx circuit;
generating, by the CGN, filter coefficients to send to a compensator circuit in the compensator apparatus; and
generating, by the compensator circuit, the compensated output signal based on the filter coefficients.

20. The method of claim 11, wherein the input to the neural network in the compensator apparatus further includes information of operating conditions of the RF Rx circuit.

* * * * *